(12) United States Patent
Kremin et al.

(10) Patent No.: US 11,307,712 B2
(45) Date of Patent: Apr. 19, 2022

(54) SYSTEMS, METHODS, AND DEVICES FOR CAPACITIVE SENSING WITH SINUSOIDAL DEMODULATION

(71) Applicant: Cypress Semiconductor Corporation, San Jose, CA (US)

(72) Inventors: Viktor Kremin, Lviv (UA); Oleksandr Pirogov, Lviv (UA); Vadym Grygorenko, Lviv (UA); Jens Weber, Pinneberg (DE)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/127,760

(22) Filed: Dec. 18, 2020

(65) Prior Publication Data
US 2021/0311604 A1    Oct. 7, 2021

Related U.S. Application Data

(60) Provisional application No. 63/006,298, filed on Apr. 7, 2020.

(51) Int. Cl.
*G06F 3/044*  (2006.01)
*G06F 3/041*  (2006.01)

(52) U.S. Cl.
CPC .......... *G06F 3/04182* (2019.05); *G06F 3/044* (2013.01); *G06F 3/04166* (2019.05)

(58) Field of Classification Search
CPC .. G06F 3/04182; G06F 3/04166; G06F 3/044; G06F 3/0446
See application file for complete search history.

(56) References Cited

U.S. PATENT DOCUMENTS

| 7,995,679 | B2 | 8/2011 | Ranganathan et al. |
| 8,031,094 | B2 | 10/2011 | Hotelling et al. |
| 8,085,247 | B2 | 12/2011 | Wilson |
| 8,610,443 | B1 * | 12/2013 | Ryshtun ............. G06F 3/04182 324/683 |
| 8,988,390 | B1 | 3/2015 | Krah et al. |
| 10,120,498 | B2 | 11/2018 | Gray |
| 10,126,884 | B2 | 11/2018 | Schwartz |
| 10,664,095 | B2 | 5/2020 | Vu et al. |
| 10,712,866 | B2 | 7/2020 | Krah et al. |
| 2012/0013565 | A1 | 1/2012 | Westhues et al. |

(Continued)

OTHER PUBLICATIONS

Chang-Ju Lee, et al., Fully Differential Touch Screen Controller with Wide Input Dynamic Range for Thin Displays, Sensors, MDPI, 2020, 17 pages.

*Primary Examiner* — Amit Chatly

(57) ABSTRACT

Systems, methods, and devices improve the sensitivity of capacitive sensors. Devices may include an attenuator configured to receive an input from at least one sense electrode of a capacitive sensing device. The attenuator may be included in a sensing channel of a capacitive sensor. Devices may further include a signal generator coupled to an input of the attenuator. The signal generator may include one or more processors configured to generate a sinusoidal signal based, at least in part, on one or more noise characteristics of a scan sequence associated with one or more transmit electrodes of the capacitive sensing device, and provide the sinusoidal signal to the input of the attenuator.

17 Claims, 13 Drawing Sheets

(56) References Cited

U.S. PATENT DOCUMENTS

| | | | |
|---|---|---|---|
| 2015/0177868 A1* | 6/2015 | Morein | G06F 3/0442 |
| | | | 345/174 |
| 2015/0346862 A1* | 12/2015 | Schwartz | G06F 3/04182 |
| | | | 345/174 |
| 2016/0357288 A1* | 12/2016 | Chao | G06F 3/0416 |
| 2017/0220177 A1* | 8/2017 | Kuo | G06F 3/0418 |
| 2017/0344144 A1* | 11/2017 | Pedersen | G06F 3/04184 |
| 2018/0024667 A1 | 1/2018 | Moseley | |
| 2020/0110506 A1 | 4/2020 | Rosenberg et al. | |
| 2020/0241688 A1 | 7/2020 | Leigh et al. | |
| 2021/0303152 A1* | 9/2021 | Hosur | G06F 3/0418 |

* cited by examiner

SYSTEMS, METHODS, AND DEVICES FOR CAPACITIVE SENSING WITH SINUSOIDAL DEMODULATION

CROSS-REFERENCE TO RELATED APPLICATIONS

This application claims the benefit under 35 U.S.C. § 119(e) of U.S. Provisional Patent Application No. 63/006,298 filed on Apr. 7, 2020, which is incorporated herein by reference in its entirety for all purposes

TECHNICAL FIELD

This disclosure generally relates to capacitive sensors, and more specifically, to improving the external noise immunity of such capacitive sensors.

BACKGROUND

Devices and systems, such as mobile communications devices, may include various input devices such as touchscreens and buttons. The touchscreens and buttons may utilize one or more sensing modalities to receive the inputs from an entity, such as a user of a mobile communications device. An example of such a modality may be capacitive sensing in which a touchscreen or button may include conductive elements which may be used to obtain various capacitance measurements. For example, a touchscreen may include an array of electrodes and a touchscreen controller may be used to measure capacitances associated with those electrodes. However, many capacitive sensors remain limited because they are prone to be sensitive to the external noise, as may result from their sensing channels are sensitive to the harmonics of the operation frequency.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as not to unnecessarily obscure the described concepts. While some concepts will be described in conjunction with the specific examples, it will be understood that these examples are not intended to be limiting.

Figure 1A:
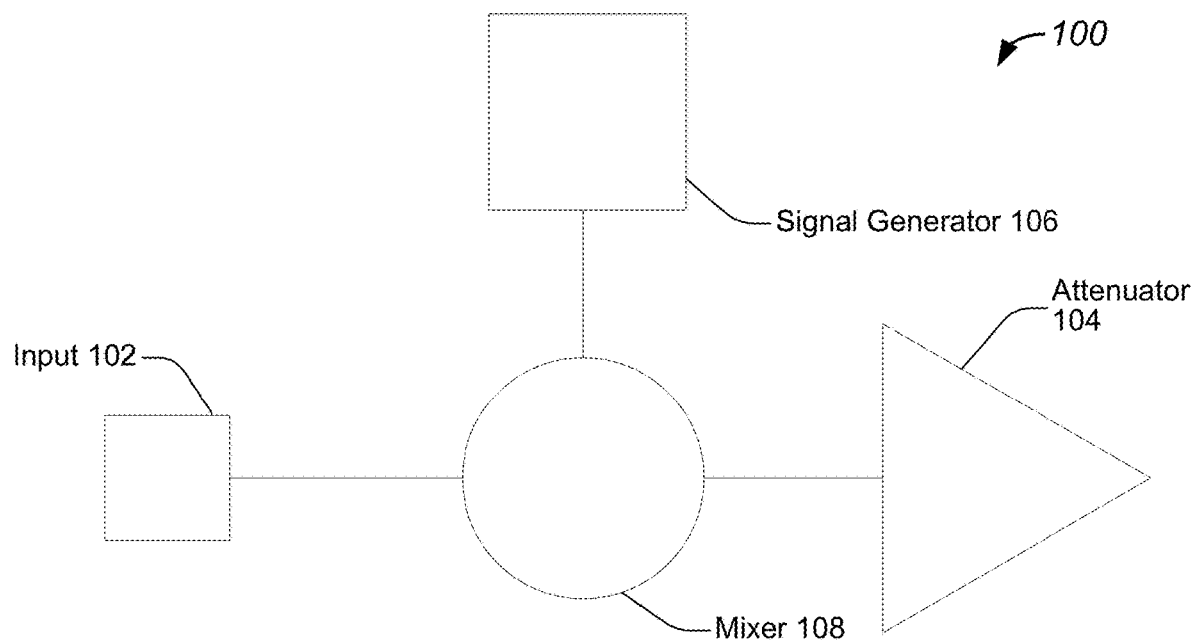
FIG. 1A illustrates an example of a device for noise immunity enhancement of capacitive sensors, configured in accordance with some embodiments.

FIG. 1A illustrates an example of a device for noise immunity enhancement of capacitive sensors, configured in accordance with some embodiments. As will be discussed in greater detail below, a capacitive sensor may include various components configured to utilize capacitance measurements to identify the presence of objects. As disclosed herein, a presence may refer to a contact, hover, or other sensed event. For example, a capacitive sensor may utilize various electrodes to sense the proximity or contact with a user's finger based on capacitance-based measurements. More specifically, the capacitive sensor may include a sensing channel that has an input attenuator that is configured to receive a sensed input from a sensing device, such as a touch panel that may include a capacitive touch screen. As will be discussed in greater detail below, a device, such as device 100, may be configured to modulate an input signal received by the input attenuator to reduce noise and increase the sensitivity of downstream components used to make measurements when sensing operations are performed by the capacitive sensor.

Accordingly, device 100 includes input 102 which may be an input that is coupled to one or more components of a sensing device. As similarly discussed above, capacitive sensors may include sensing devices that include electrodes used to make various measurements that may be used to infer the presence of an adjacent or contacting object, such as a finger, stylus, or other conductive object. It will be appreciated that any suitable conductive object may be used. Moreover, such objects may be made of any suitable materials that change the physical surrounding of sensing electrodes such that the capacitance changes. More specifically, a sensing device may be a touch panel that includes an array of transmit electrodes as well as an array of receive electrodes. A scan sequence may be implemented in which a signal is sent through one or more of the transmit electrodes, and measurements are made at one or more of the receive electrodes. The measurements may be capacitance measurements, and may be affected by an adjacent or contacting object. For example, a user's finger contacting or hovering near the touch panel at a particular location may affect capacitance measurements of electrodes at that location. The sensed signal from the receive electrodes may be received at input 102.

Device 100 further includes attenuator 104 which is configured to set an input impedance seen by a sensing device, such as the touch panel, and is also configured to set an output impedance seen by other components of sensing channel, as will be discussed in greater detail below with reference to at least FIGS. 3 and 4. Accordingly, the sensed signal received at input 102 may be coupled to an input of attenuator 104. Thus, according to various embodiments, attenuator 104 is configured to provide several features. More specifically, it attenuates an input signal, it provides the feature of impedance conversion, it provides a low input impedance and a high output impedance, and it acts as a current source where the output current is determined based on the input current.

Device 100 additionally includes signal generator 106 which is configured to generate a signal that is configured to reduce particular characteristics of the input signal sensed at input 102. As will be discussed in greater detail below, the sensed signal may be prone to external noise that may arise from various sources. For example, noise may be generated by other components such as a liquid crystal display (LCD) panel, as well as capacitive coupling between components or even a user's finger, like charger noise. In various sensing channel embodiments, the noise may present as increased sensitivity at odd harmonics of a frequency that may be used during sensing operations. For example, a scanning sequence of electrodes included in touch panel may involve a scanning burst implemented at a particular scanning frequency. The noise sources noted above and associated parasitic capacitances may result in increased sensitivity to the noise at odd harmonics of the scanning frequency. For example, increases in a measured signal may occur at a third, fifth, seventh, and ninth harmonic of the scanning frequency. Such measured harmonics are not desirable as they are largely products of noise characteristics of the sensing channel, and not the underlying touch/hover that is being measured. Accordingly, some capacitance sensing channels might be sensitive to odd harmonics of the operation frequency.

Embodiments disclosed herein remove sensing channel sensitivity to the odd harmonics without major or expensive modifications of the channel itself. As will be discussed in greater detail below, this may be accomplished by adding a mixer as part of the existing sensing channel. The mixer provides input current multiplication on non-negative numbers of harmonics (including zero, meaning the gain is equal to zero). In various embodiments, the mixer input waveform is a rectified sinusoidal signal with a same frequency as a transmit signal. It will be appreciated that mixer implementations might be different in various embodiments. For example, mixers might be implemented as variable gain amplifiers with discrete gain levels, or driven by a sigma-modulator output. In one embodiment, the mixer is an on/off switch, that operates at a relatively high over-sample frequency, e.g. 48 MHz for the 100 kHz of the transmit signal. As will also be discussed in greater detail below, various features of the mixer can be implemented inside of a sensing channel by, for example, varying the attenuator gain at the front of attenuator, as may be accomplished by using the previously described switch.

In various embodiments, the signal generated by signal generator 106 is configured to reduce or attenuate the effects of these noise sources on the sensed signal. Signal generator 106 provides a rectified sinusoidal waveform having a frequency determined by the operation frequency of a transmit signal. The waveform amplitude is configured to provide mixer operation in a linear range and prevent analog saturation. In this way, adding an analog mixer, driven by the rectified sinusoidal signal at the front of the sensing channel removes the sensitivity to the odd harmonics. In various embodiments, the operation frequency is configured to provide a lowest noise level of output readings in the presence of external noise (like LCD noise). Thus, the operation frequency is configured such that there is reduced overlapping in the frequency domain of the noise spectrum with the sensing channel frequency response. Removing sensitivity to the odd transmit frequency harmonics provides reduction in noise spectrums overlapping and additionally provides external noise attenuation. The result of noise attenuation is increasing the signal-to-noise ratio of the capacitance sensing system. As discussed above, an output of signal generator 106 is coupled with a mixer, such as mixer 108. Accordingly, mixer 108 is configured to multiply the output of signal generator 106 with the sensed signal received at input 102, and provide the result as an input to attenuator 104, as discussed above.

Figure 1B:
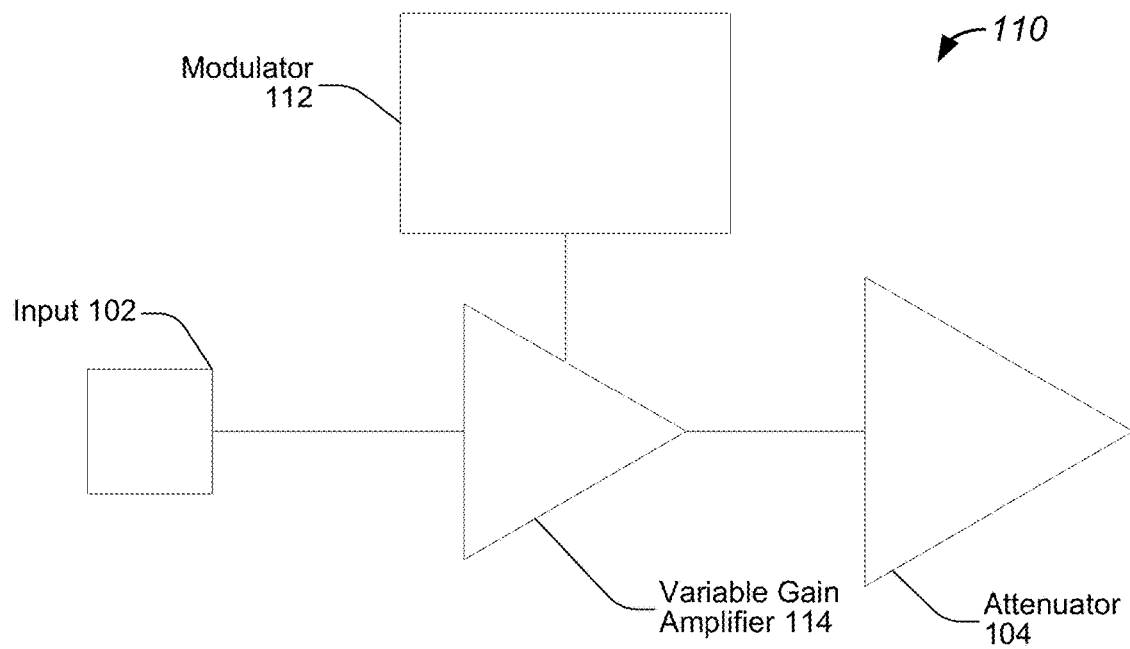
FIG. 1B illustrates another example of a device for noise immunity enhancement of capacitive sensors, configured in accordance with some embodiments.

FIG. 1B illustrates another example of a device for the external noise immunity enhancement of capacitive sensors, configured in accordance with some embodiments. As similarly discussed above, a device, such as device 110, may be configured to modulate an input signal received by an input attenuator to reduce the off-band) noise (noise that is outside a transmit frequency) and increase the sensitivity of downstream components used to make measurements when sensing operations are performed by a capacitive sensor.

As also discussed above, device 110 may also include input 102 and attenuator 104. In various embodiments, device additionally includes modulator 112 which may be included in a signal generator and may be coupled to variable gain amplifier 114. Accordingly, as shown in FIG. 1B, modulator 112 is configured to generate a signal that is configured to reduce noise characteristics of the input signal sensed at input 102. Moreover, variable gain amplifier 114 is configured as a mixer, and is configured to combine the signal generated by modulator 112 with the sensed signal received at input 102. In this way, variable gain amplifier 114 is configured to operate as an analog mixer, and attenuate the off-band noise components (those that are outside of the sensing channel passband) of a sensing channel, as discussed above. Additional details of configurations of variable gain amplifiers are discussed in greater detail below with reference to FIGS. 3A-3C.

Figure 2:
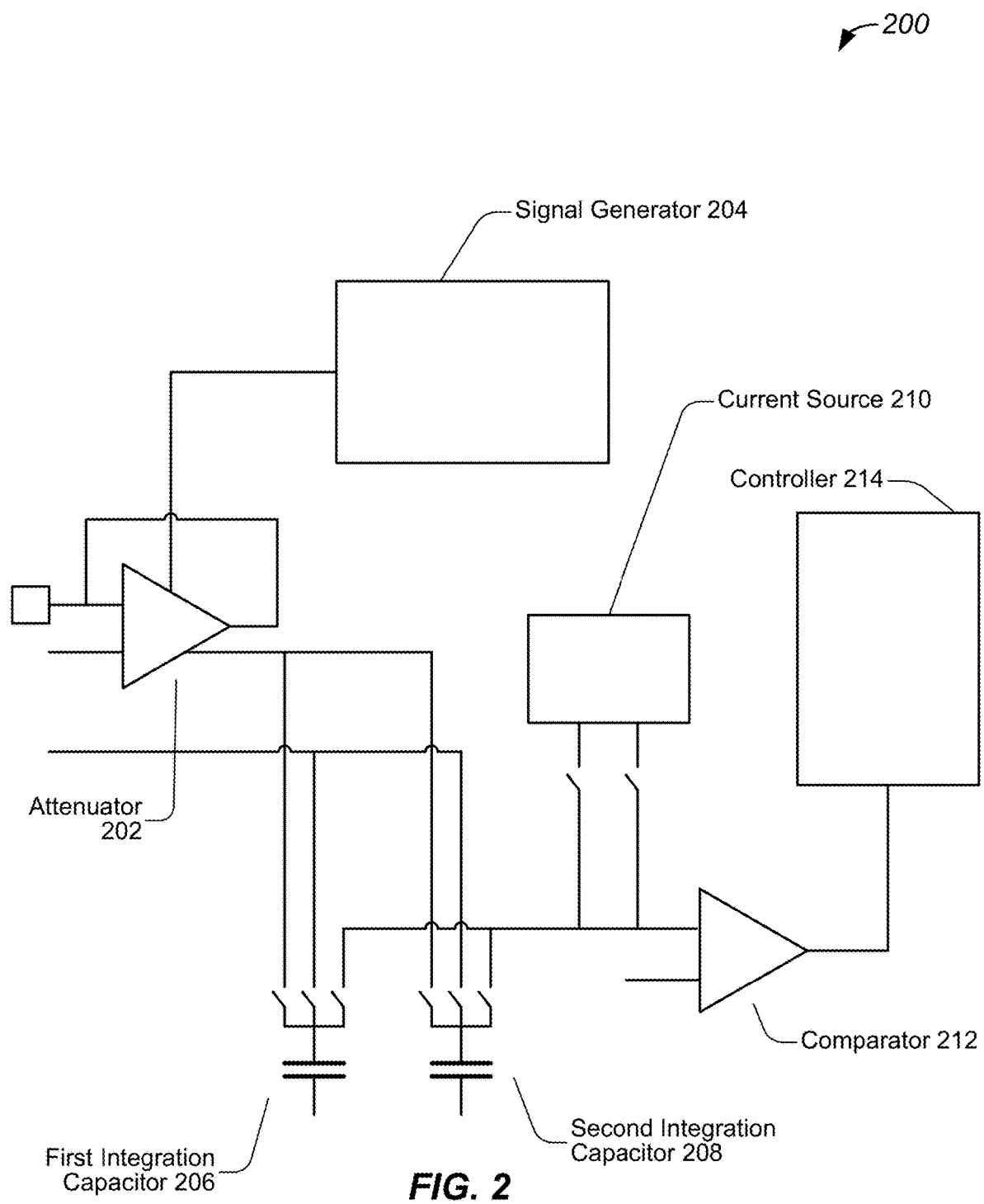
FIG. 2 illustrates an example of an improved charge-to-time converter, configured according to some embodiments.

FIG. 2 illustrates an example of a system for enhancing noise immunity of capacitive sensors, configured in accordance with some embodiments. As similarly discussed above, a capacitive sensor may include various components configured to utilize capacitance measurements to identify the presence of objects. For example, a capacitive sensor may utilize various electrodes to sense the presence or contact with a user's finger based on capacitance-based measurements. In various embodiments, a system, such as system 200, may be configured to initialize and utilize a signal generator to reduce noise, and therefore improve the Signal-to-Noise ratio.

Accordingly, system 200 includes attenuator 202 which is configured to set an input impedance seen by a sensing device, such as a touch panel, and also configured to set an output impedance seen by other components of system 200 discussed in greater detail below. Accordingly, attenuator 202 may be configured to decrease an input current and provide a low input impedance for a touch panel input current. Moreover, attenuator 202 may be further configured to provide a high output impedance for various components, such as capacitors discussed in greater detail below. In various embodiments, attenuator 202 as well as components of system 200 are implemented as a sensing channel of a capacitive sensor. In various embodiments, the sensing channel operates as a charge balancing charge-to-the-time converter circuit.

System 200 also includes signal generator 204 which is configured to generate a gain control signal that is provided to attenuator 202, and configured to reduce particular characteristics of an input signal sensed at an input, which may be received from one or more electrodes in a touch panel. As will be discussed in greater detail below, in some embodiments, signal generator 204 is configured to include a demodulator that is configured to generate a rectified sinusoidal waveform that may be provided to attenuator 202. Accordingly, an output signal generated by signal generator 204 may be used to change the gain of attenuator 202 in accordance with the output signal. When configured in this way, attenuator 202 operates as an analog mixer that multiplies the input signal received from sensing electrodes with the rectified sinusoidal waveform. Therefore, a gain of attenuator 202 changes in, for example, a range $0 \ldots K_{MAX}$, where the $K_{MAX}$ is maximum level of the gain. In various embodiments, an attenuator input signal is bipolar, but the gain change factor is unipolar. In some embodiments, signal generator 204 is configured to implement a look-up-table (LUT) that is used to determine values of the gain of signal generator 204 using pre-programmed set of gain levels. Accordingly, a pre-programmed LUT may be used instead of a demodulator. Moreover, as will also be discussed in greater detail below, signal generator 204 may be further configured to implement windowing via a window function to further narrow a frequency response peak, and to further increase the noise attenuation of system 200 and improvement of the Signal-to-Noise ratio. In various embodiments, signal generator 204 is implemented using single-bit (dual level) or multi-bit (multi-level) sigma-delta modulators.

System 200 further includes first integration capacitor 206 and second integration capacitor 208 which are configured to implement various operations, such as balancing of an output of the integrated charge coming from attenuator 202 that may be generated based on a received or sensed input. Accordingly, first integration capacitor 206 may be an even phase integration capacitor, and second integration capacitor may be an odd phase integration capacitor, and together they may implement time-separated (interlaced) phases of charge accumulation and balancing. In various embodiments, an output of system 200 is generated using balancing time intervals that are represented as numerical values determined in proportion to the total charge integrated by one or more of the integration capacitors during half of a transmit period or other appropriate time interval. The integration of multiple balancing intervals (e.g. for 10 transmit periods, and 20 intervals in total) produces a baseline value.

System 200 additionally includes current source 210, which may be a balancing current source, configured to generate a current associated with first integration capacitor 206 and second integration capacitor 208 discussed above. In various embodiments, the current is used to charge first integration capacitor 206 and second integration capacitor 208. For example, a digitizer may use the current to charge and discharge the integration capacitors. Thus, current source 210 may have several different uses, depending on particular features of the sensing channel in which it is included. In one example, it might be used for both digitization and calibration associated with balancing operations. Accordingly, current source 210 may include source and sink current sources that are configured to generate the appropriate current used during balancing operations. As shown in FIG. 2, current source 210, first integration capacitor 206, and second integration capacitor 208 may be coupled to comparator 212, which may be configured to detect changes of voltages of first integration capacitor 206 and second integration capacitor 208 with respect to a reference voltage.

System 200 further includes controller 214 configured to measure an output of comparator 212, as well as generate various different control signals used by other components of system 200. For example, controller 214 may be configured to generate control signals for balancing operations, for control over coupling of first integration capacitor 206 and second integration capacitor 208, a reset operation, as well as initialization of attenuator 202 at the beginning of a capacitance conversion. In this way, controller 214 may obtain measurements made by the sensing channel implemented by system 200, and may control various components within system 200.

Figure 3A:
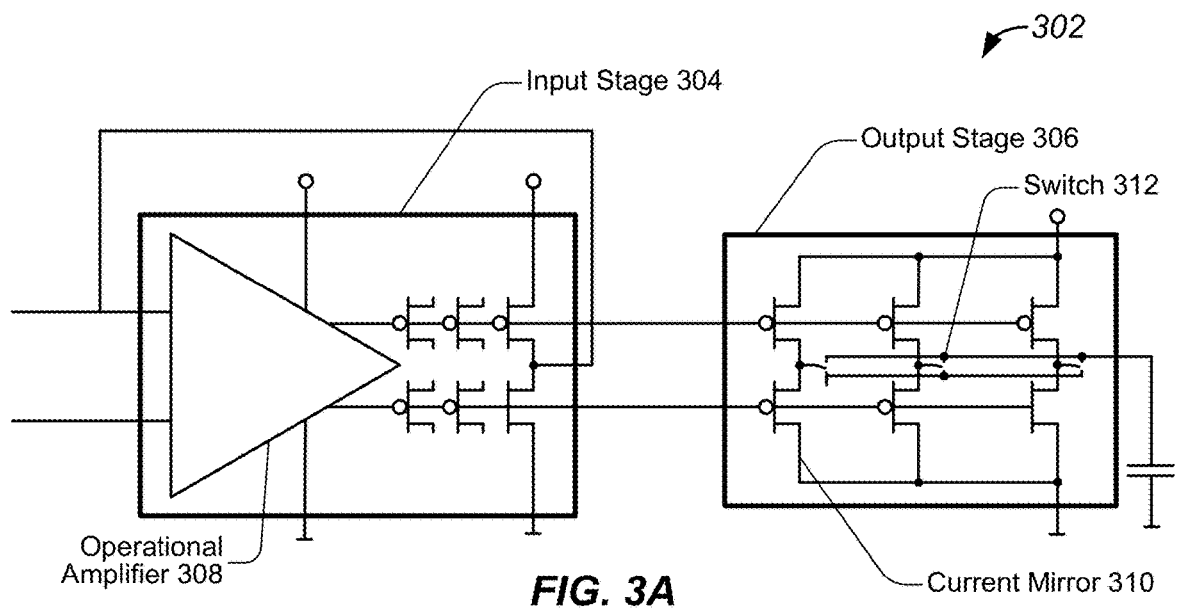
FIG. 3A illustrates an example of a variable gain attenuator, configured in accordance with some embodiments.

FIG. 3A illustrates an example of an attenuator, configured in accordance with some embodiments. As discussed above, an attenuator, such as attenuator 302, may be implemented in the context of a sensing channel, and may have its gain modulated to reduce or attenuate undesirable noise characteristics of a sensed signal, as may occur at odd harmonics of a scanning frequency. Accordingly, attenuator 302 may be specifically configured to implement a variable gain in such a manner.

More specifically, attenuator 302 may include input stage 304, which may have a fixed gain, and output stage 306, which may have a variable gain. As shown in FIG. 3A, input stage 304 includes operational amplifier 308, and output stage 306 includes multiple current mirrors, such as current mirror 310. Moreover, output stage 306 includes multiple switches, such as set of switches 312, such that each current mirror has an individual switch, and each current mirror may be selectively coupled or decoupled to the output of attenuator 302. In various embodiments, the switches are controlled via control signals to dynamically couple and decouple various current mirrors during a sensing operation. In this way, operation of the switches may be controlled to implement current summing of the current mirrors in a dynamically configurable manner where an amplitude of the output current of attenuator 302 is directly proportional to the number of coupled current mirrors. As discussed above, such control signals may be generated by a component, such as a controller.

As also discussed above, the output of attenuator 302 may be coupled to one or more capacitors, such as integration capacitors (Cint). Accordingly, configuration of the gain of attenuator 302 may affect the output current so the attenuator gain modulation affects a total charge in an integration capacitor and a corresponding voltage on the integration capacitor. Due to the configuration of the implementation of multiplication of the input signal on the rectified sinusoidal signal, off-band noise is attenuated, so sensitivity to odd harmonics of the transmit frequency is reduced.

Figure 3B:
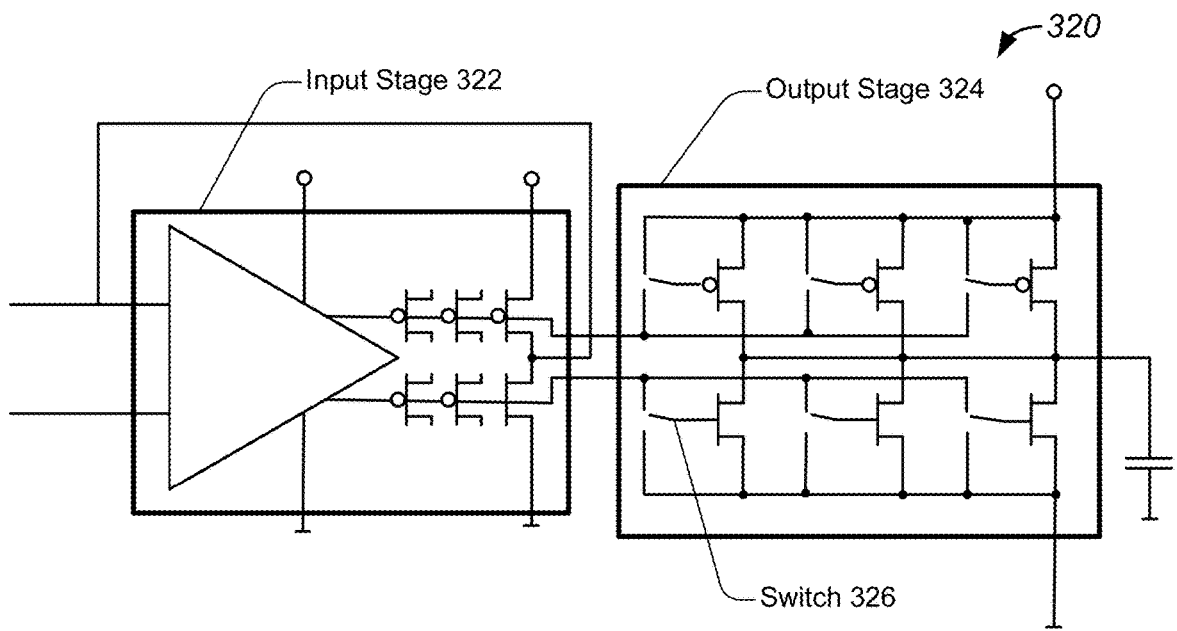
FIG. 3B illustrates another example of a variable gain attenuator, configured in accordance with some embodiments.

FIG. 3B illustrates another example of an attenuator, configured in accordance with some embodiments. As discussed above, an attenuator, such as attenuator 320, may be implemented in the context of a sensing channel, and may have its gain modulated to reduce or attenuate undesirable noise characteristics of a sensed signal, as may occur at odd harmonics of a scanning frequency. As also discussed above, attenuator 320 may include input stage 322 and output stage 324 which may include various current mirrors and switches.

As discussed above with reference to FIG. 3A, switches may be used to control current mirror outputs for currents summing. As shown in FIG. 3B, switches, such as switch 326, may be used to control gate circuits of the current mirrors. Accordingly, as shown in FIG. 3B, the configuration of the current mirrors and switches may be implemented such that gate switching is used to control operation of the current mirrors. Accordingly, control signals may be generated to dynamically control operation of gate switches as well as activation of transistors included in the current mirrors. Thus, in various embodiments, gate switches may be used to modify an output current of attenuator 320 as well as a voltage applied to downstream integration capacitors.

Figure 3C:
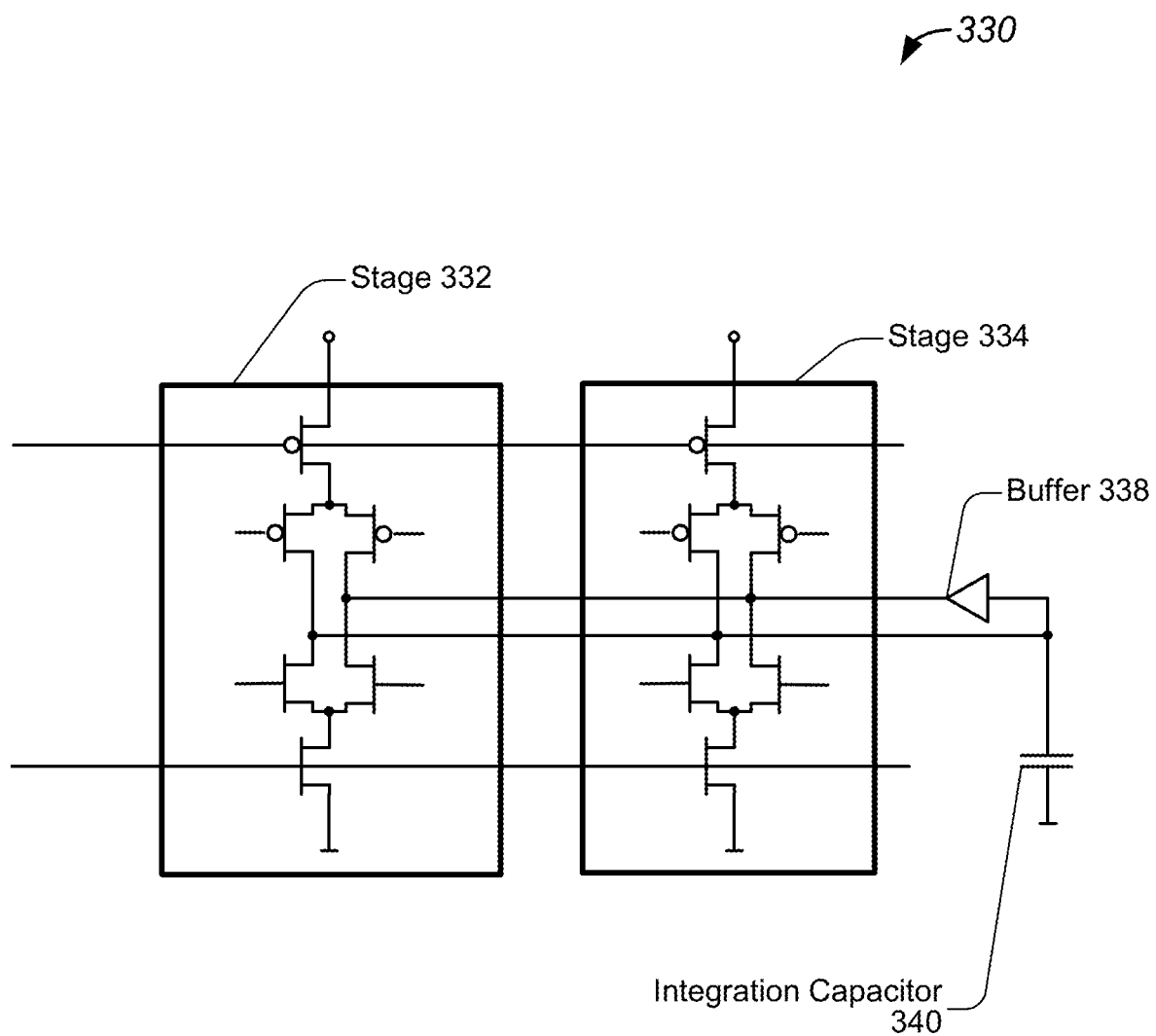
FIG. 3C illustrates yet another example of a variable gain attenuator, configured in accordance with some embodiments.

FIG. 3C illustrates yet another example of a variable gain attenuator, configured in accordance with some embodiments. As discussed above, an attenuator, such as attenuator 330, may be implemented in the context of a sensing channel, and may have its gain modulated to reduce or attenuate undesirable noise characteristics of a sensed signal, as may occur at odd harmonics of a scanning frequency. In various embodiments, attenuator 330 is configured to use low-voltage, low-injection differential stages to implement current switching between integration capacitors and an analog buffer. In various embodiments, the differential current switches re-distribute current mirror output current between an integration capacitor and a buffer output. Distributing current in this way ensures that a voltage on the integration capacitor remains the same, and provides the ultra-low injection gain adjustment.

Accordingly, attenuator 330 may include stage 332 and stage 334 which may be coupled to integration capacitor 336 and buffer 338. As shown in FIG. 3C, stage 332 may be a differential stage that operates at a relatively lower switching voltage, such as 100 mV. Accordingly, the configuration of stage 332 results in a lower parasitic injection in integration capacitor 336. Moreover, stage 334 may include components similar to those shown in stage 332 In various embodiments, attenuator 330 may include one or more differential current switch stages, such as stage 332. In various embodiments, an output current going to integration capacitor 340 is determined by a number of the stages that are active or "turned-on" at same time, and this number varies based on a half-period of a rectified sinusoidal waveform, as similarly discussed above.

Moreover, while FIG. 3C illustrates attenuator 330 has having two identical differential current switches, it will be appreciated that attenuator 330 may have any number of differential current switches. For example, a number of current switches may be determined based on one or more features of an output of a modulator, as discussed above. More specifically, the modulator may be a multi-level delta-sigma modulator, and the number of stages may be determined based on the number of levels used by the delta-sigma modulator.

Figure 4:
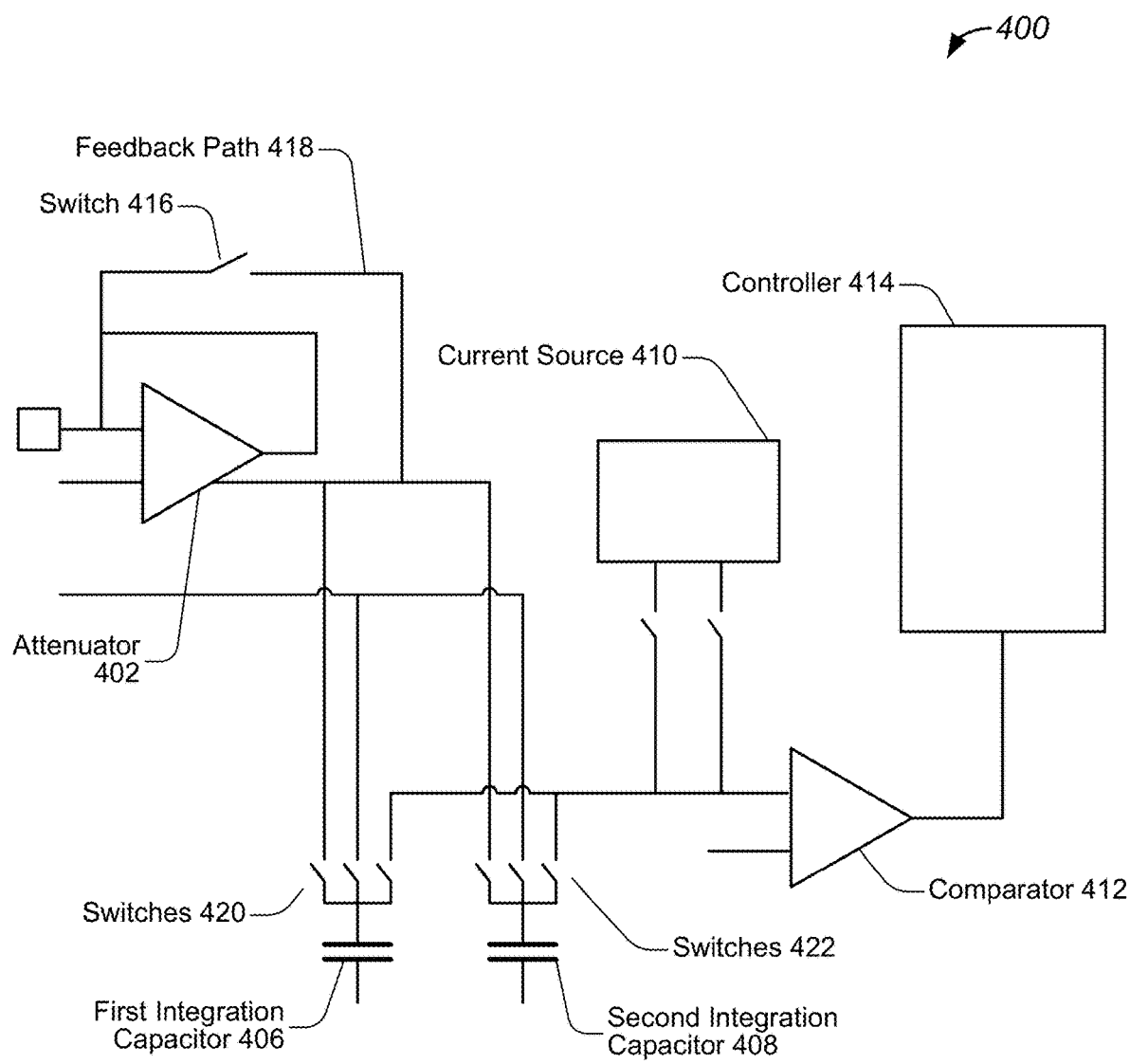
FIG. 4 illustrates another example of the improved charge-to-time converter, configured according to some embodiments.

FIG. 4 illustrates another example of a system for noise immunity enhancement of capacitive sensors, configured in accordance with some embodiments. As similarly discussed above, a system, such as system 400, may be configured to initialize and utilize a signal generator to reduce noise and increase the signal to-noise ratio when making measurements. As also discussed above, system 400 may include attenuator 402, first integration capacitor 406, second integration capacitor 408, current source 410, comparator 412, and controller 414.

As shown in FIG. 4, system 400 additionally includes switch 416 which is included in attenuator feedback path 418. When turned-on, switch 416 couples a current output of attenuator 402 back to its sensed input, and attenuator 402 is set in a reset or initialized state. More specifically, switch 416 may be turned-on to keep attenuator 402 in the reset state when the integration capacitors are disconnected, thus preventing parasitic charge accumulation at the attenuator output stage. In various embodiments, control signals may be specifically configured to control the operation of switch 416 as well as other components to reduce parasitic charge accumulation and thus reduce the noise present in obtained measurements. More specifically, a control signal may be configured to control the operation of switch 416, and additional control signals may be configured to control the operation of switches 420 and switches 422 coupled to first integration capacitor 406 and second integration capacitor 408. The control signals may be generated based on values stored in a timer table, and thus may be generated based on a table of data values that operates as a LUT. Such a timer table may be stored in a set of registers, and may include data values that define sequences of coupling and uncoupling of switches in a manner that may be implemented periodically.

As will be discussed in greater detail below, the timer table may be generated by first implementing a frequency sweep to identify frequencies that need to be attenuated, and then generating the timer table based on the identified frequencies. In this way, values of the control signals and operation of the switches may be implemented using a LUT during scanning operations. Accordingly, a switch control signal may be a single-bit representation of a rectified sinusoidal signal and can be generated in any suitable way (e.g. via implementation of a single-bit sigma-delta modulator, LUT, timer-table etc.).

Figure 5A:
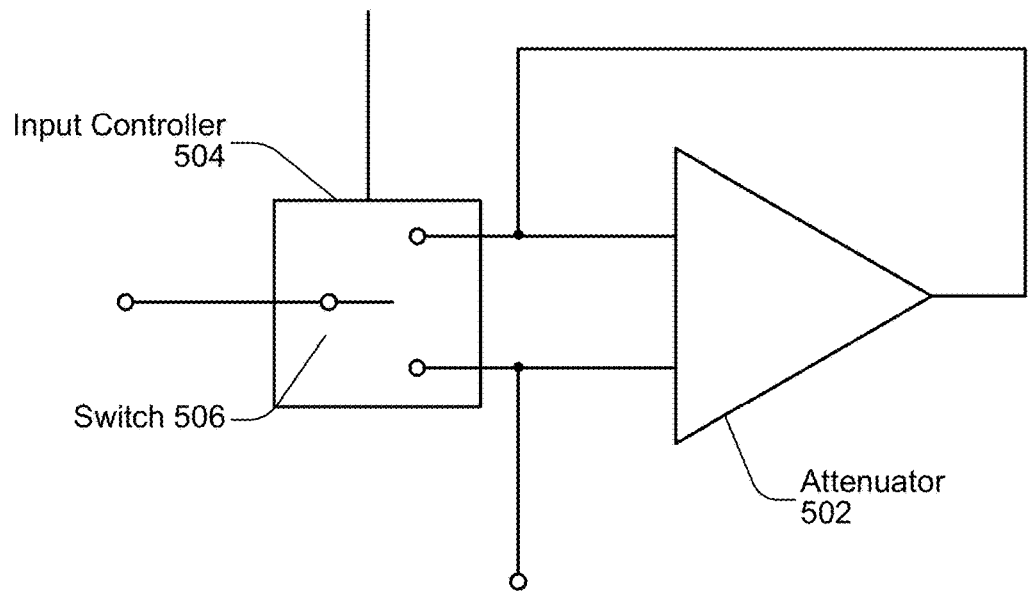
FIG. 5A illustrates an implementation of an example of a variable gain attenuator, configured in accordance with some embodiments.

FIG. 5A illustrates an implementation of an attenuator, configured in accordance with some embodiments. As also discussed above, an attenuator, such as attenuator 502, may be configured such that an input to the attenuator is modulated to reduce sensitivity to off-band transmit frequency components. As shown in FIG. 5A, attenuator 502 may be coupled to input controller 504 that includes switch 506. In various embodiments, switch 506 is configured to toggle coupling between a sensed input and different inputs of attenuator 502. For example, in a first position, switch 506 may couple the input to a first input of attenuator 502, which is also coupled to a feedback path. In a second position, switch 506 couples the input to the second input of attenuator 502, which is also coupled to a reference voltage. In various embodiments, switch 506 may be a single-pole double throw (SPDT) switch. Moreover, operation of switch 506 may be controlled via a timer table configured as a LUT, as discussed above. Therefore, switch 506 is configured to provide a single bit (dual level: gain factor is zero or one) discrete-time mixer that reduces external, out of transmit band noise components similar to other discrete time mixer/variable gain attenuator implementations as discussed above with reference to FIGS. 3A-3C.

Figure 5B:
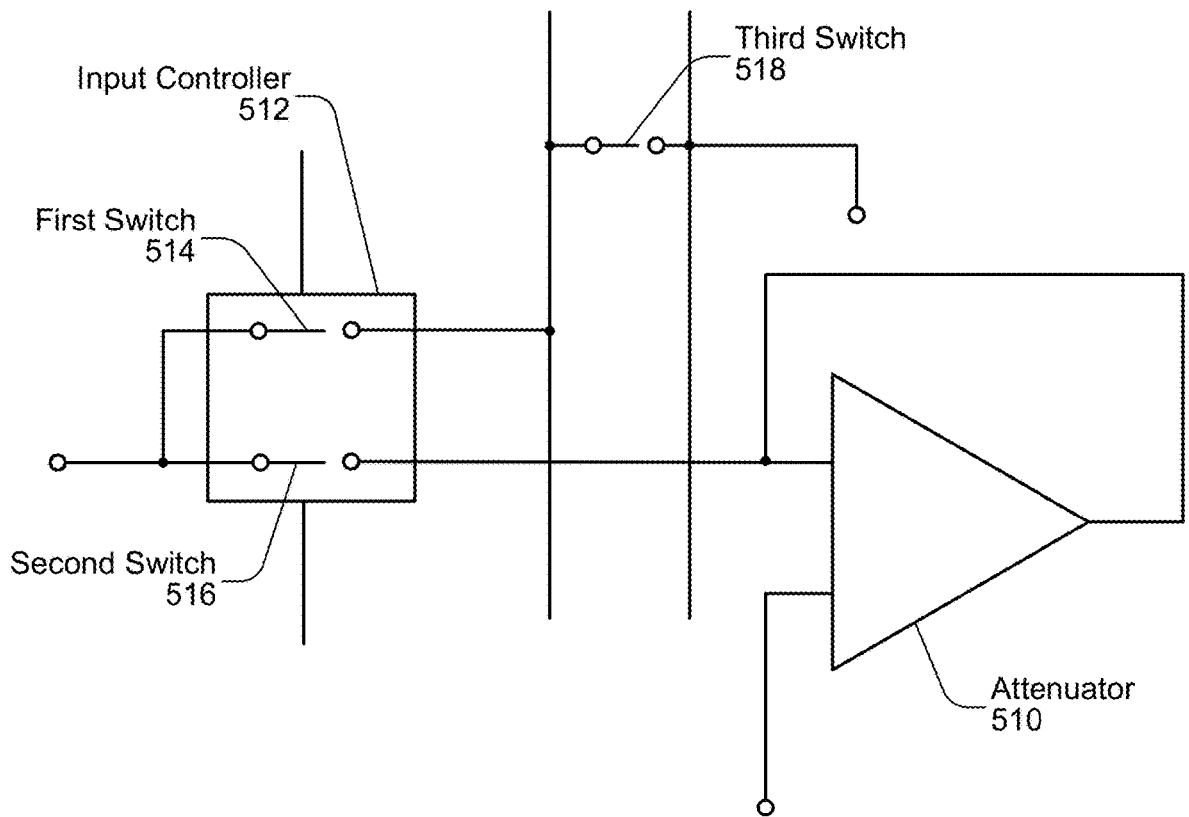
FIG. 5B illustrates an implementation of an example of an attenuator, configured in accordance with some embodiments.

FIG. 5B illustrates an implementation of an attenuator, configured in accordance with some embodiments. As similarly discussed above, an attenuator, such as attenuator 510, may be configured such that an input to the attenuator is modulated. As also discussed above, attenuator 510 may be coupled to input controller 512 that includes first switch 514 and second switch 516. In various embodiments, first switch 514 is configured to selectively couple and decouple a sensed input from a global bus of the sensing channel associated with attenuator 510. Moreover, second switch 516 is configured to selectively couple and decouple the sensed input to an input of attenuator 510. Furthermore, third switch 518 may be implemented to couple and decouple the global bus from a reference voltage. As similarly discussed above, operation of first switch 514 and second switch 516 are controlled via a timer table configured as a LUT. In various embodiments, switches 514, 516, and 518 might be part of a programmable touch panel multiplexer structure.

Figure 6:
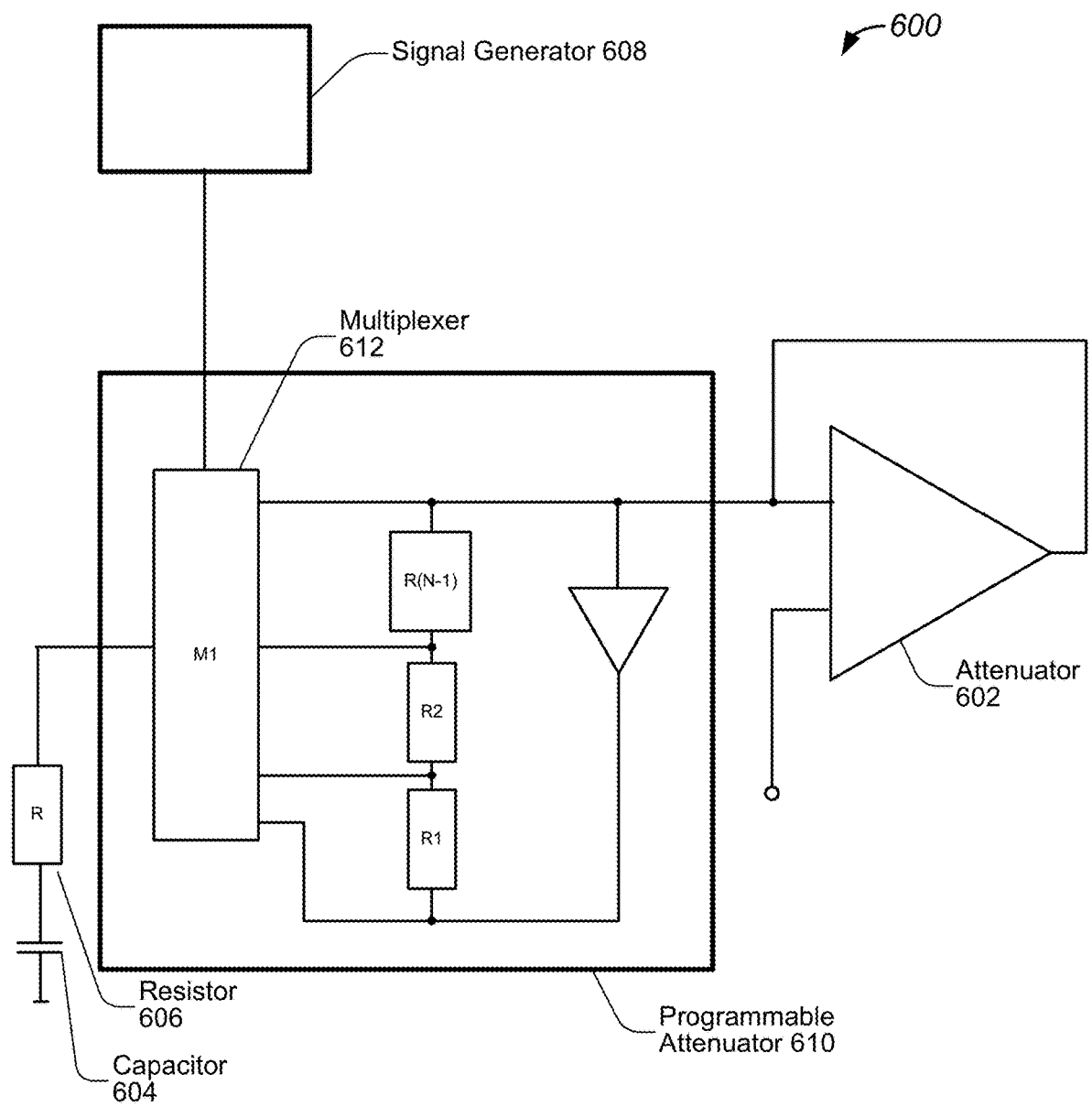
FIG. 6 illustrates an example of a variable gain attenuator, configured in accordance with some embodiments.

FIG. 6 illustrates an example of a system for noise immunity enhancement of capacitive sensors, configured in accordance with some embodiments. As similarly discussed above, a system, such as system 600, may configure and utilize a signal generator to reduce noise and increase the sensitivity of components used to make such measurements. Accordingly, system 600 may include attenuator 602, capacitor 604, resistor 606, and signal generator 608. In some embodiments, resistor 606 and capacitor 604 may be representational of an equivalent resistance and capacitance provided by a touch panel in a self-capacitance sensing mode.

As shown in FIG. 6, system 600 additionally includes programmable attenuator 610, which may be a multi-gain level attenuator, and which may be programmable to select a gain applied to an input of attenuator 602. For example, programmable attenuator 610 may include a multiplexer, such as multiplexer 612 that may be configured to select a particular input coupling path provided between an input of multiplexer 612 and attenuator 602. Each different path may have a different gain, and selection of the path may be controlled by the signal provided by signal generator 608. Thus, selection of the path provided by multiplexer 612 can be used to modify an input gain provided to attenuator 602 because each different path has a different gain determined by a unique configuration of resistors. While operation of multiplexer 612 is shown as being controlled by signal generator 608, in some embodiments, operation of multiplexer 612 is controlled via a timer table configured as a LUT. According to various embodiments, any suitable number of gain levels may be used. For example, 8 gain levels might be supported in one embodiment.

Figure 7:
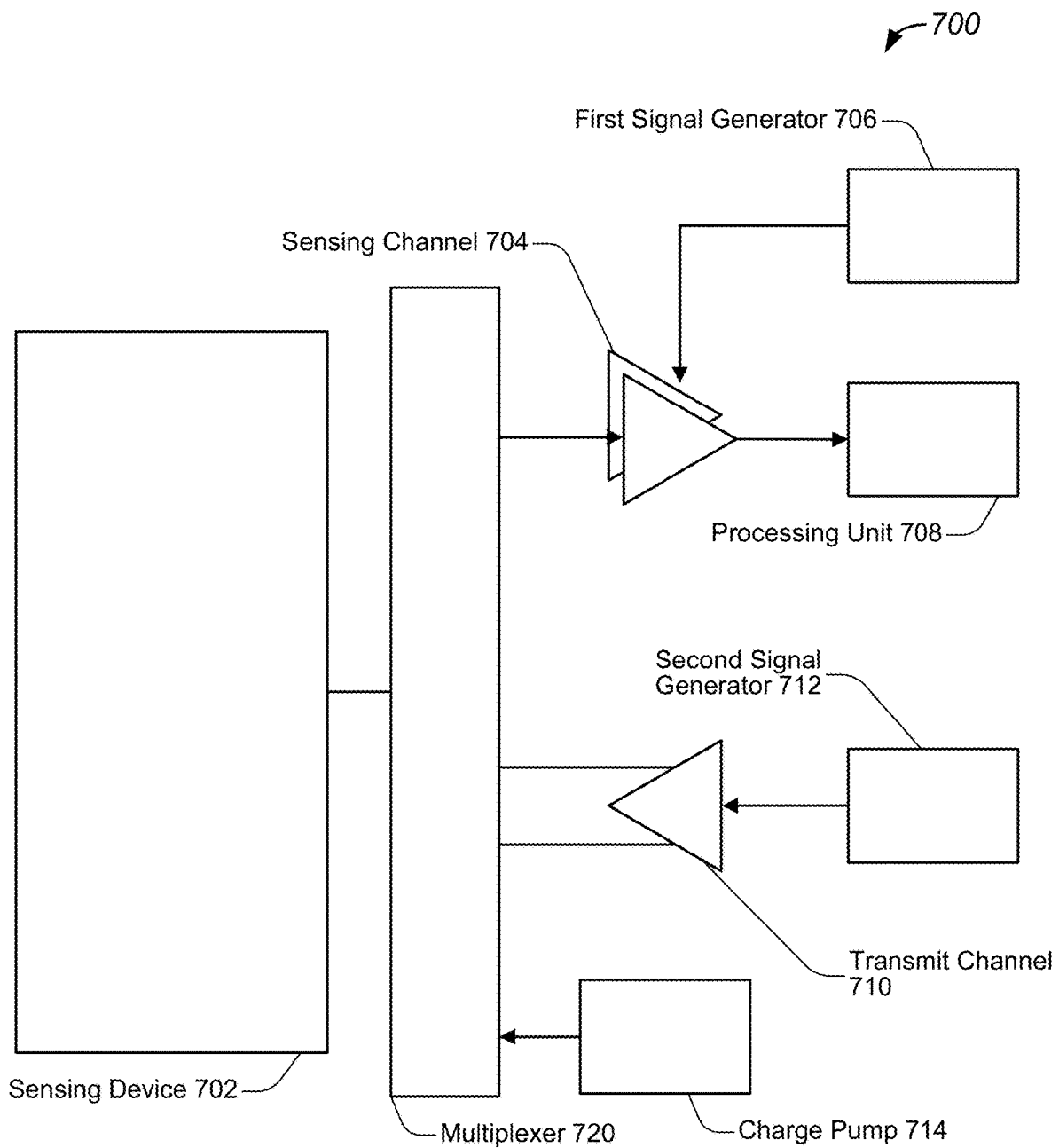
FIG. 7 illustrates an example of a system for noise immunity enhancement of capacitive sensors, configured in accordance with some embodiments.

FIG. 7 illustrates an example of a system for noise immunity enhancement of capacitive sensors, configured in accordance with some embodiments. As discussed above, systems disclosed herein are configured to obtain impedance and capacitance measurements, and identify hover and touch events based on such measurements, as may occur when a user hovers or touches a sensing device. Accordingly, a system, such as system 700 may include such a sensing device as may be implemented in the context of a capacitive sensor.

Accordingly, system 700 includes sensing device 702 which may include components, such as electrodes configured to sense changes in measured electrical properties within a designated distance of the sensing device. As discussed above, sensing device may be a touch screen, touch panel, or button that includes one or more electrodes. In one example, the electrodes may be arranged in arrays of transmit and receive electrodes, where the transmit electrodes are configured to transmit a signal in accordance with a scanning protocol or sequence, and the receive electrodes are configured to receive the signal, thus obtaining sensed measurements of an impedance between the two.

System 700 additionally includes one or more sensing channel 704 which is configured to receive the signal sensed by sensing device 702, as may be generated by receive electrodes included in sensing device. As discussed above, sensing channel 704 includes various components, such as an attenuator and integration capacitors. Additional details regarding the operation of sensing channel have been discussed above. As shown in FIG. 7, sensing channel 704 may also be coupled to components, such as first signal generator 706 and processing unit 708. As discussed above, first signal generator 706 may generate a signal that is configured to reduce noise that may be present in the measurements obtained by sensing channel 704, and may be caused by various sources such as parasitic capacitances. Furthermore, processing unit 708 may be configured to include a controller as discussed above, as well as one or more processors configured to implement other sensing operations. For example, processing unit 708 may be configured to identify and store measurement data in a memory device, as well as perform one of more computations to identify particular events, such as hover events and touch events. While first signal generator 706 and processing unit 708 have been shown as coupled to sensing channel 704, it will be appreciated that first signal generator 706 and processing unit 708 may be included in sensing channel 704.

System 700 further includes transmit channel 710 which is configured to generate a signal provided to sensing device 702 that provides the signal used during a scanning sequence, and forms the basis of subsequent measurements. Accordingly, transmit channel 710 may include various components such as an amplifier and/or a buffer as well as a current source and/or a voltage source. As shown in FIG. 7, transmit channel 710 may be coupled to second signal generator 712 as well as charge pump 714. Accordingly, second signal generator 712 may be configured to generate a signal used to drive transmit electrodes during a scanning sequence, and thus may configure the parameters of such a drive signal. Charge pump 714 may be configured to voltage regulation for transmit channel 710. Moreover, multiplexer 720 may be configured to selectively couple sensing channel 704 and transmit channel 710 with particular electrodes of sensing device 702 in accordance with a scanning sequence. Accordingly, multiplexer 720 may include a transmit multiplexer for transmit electrodes and a sensing multiplexer for sensing, also referred to herein as receive, electrodes.

Figure 8:
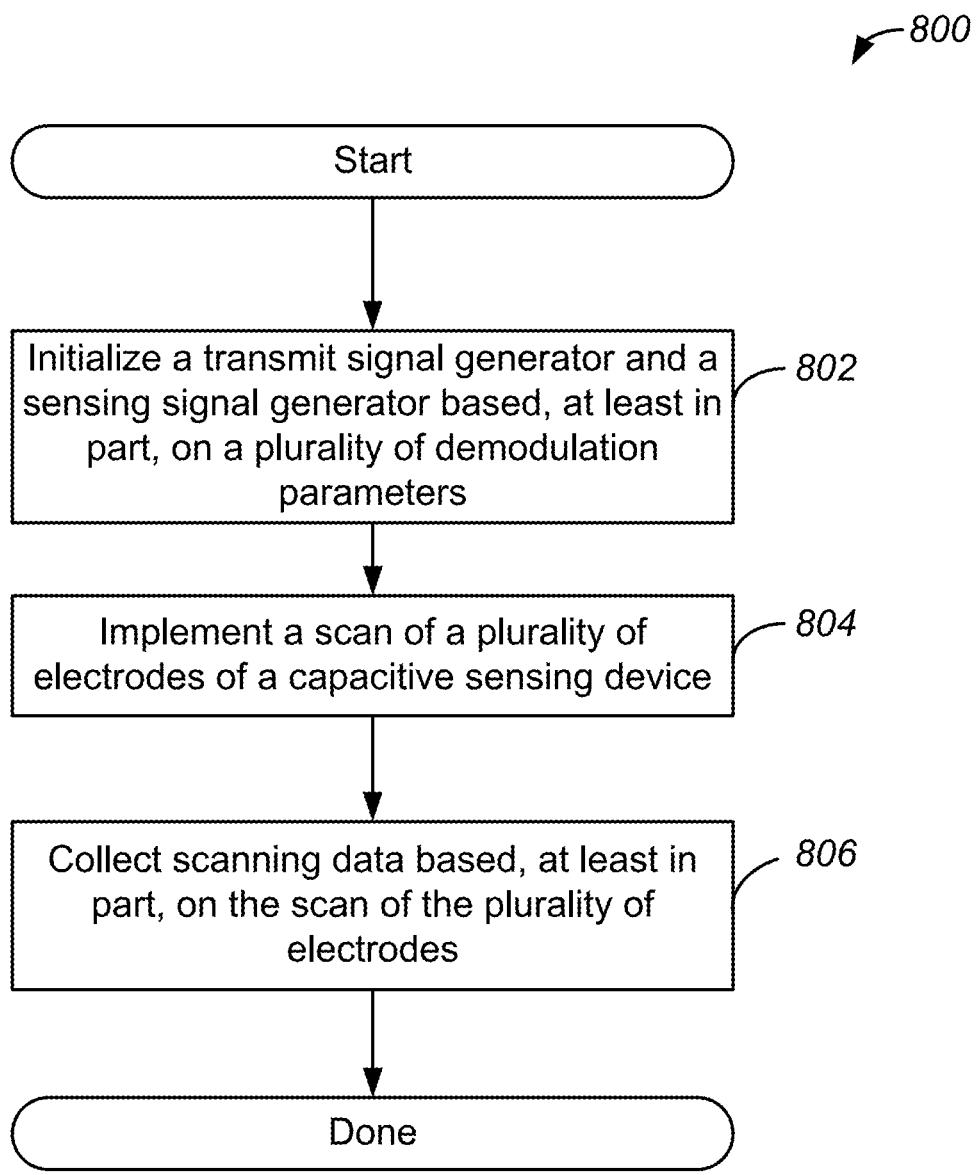
FIG. 8 illustrates a flow chart of an example of a method for scanning using one sensing slot of capacitive sensors, implemented in accordance with some embodiments.

FIG. 8 illustrates a flow chart of an example of a method for sensitivity enhancement of capacitive sensors, implemented in accordance with some embodiments. As discussed above, a capacitive sensor may include various components configured to utilize capacitance measurements to identify the presence of objects. For example, a capacitive sensor may utilize various electrodes to sense the presence or contact with a user's finger based on capacitance-based measurements. As also discussed above, operation of an attenuator gain may be modulated to reduce noise and increase the signal to noise ratio for measurements when sensing operations are performed by the capacitive sensor. Thus, according to various embodiments, a method, such as method 800, may be implemented during run time to reduce noise that may manifest at odd harmonics.

Accordingly, method 800 may commence with operation 802 during which a transmit signal generator and a sensing signal generator may be initialized based, at least in part, on a plurality of demodulation parameters. As discussed above, the transmit signal generator may be included in a transmit channel and used to drive transmit electrodes during a scanning sequence. Thus, during operation 802, the transmit signal generator may be initialized based on a designated scanning sequence or protocol. Moreover, a sensing signal generator may be a signal generator implemented in the sensing channel and used to modulate operation of one or more components of the sensing channel, as discussed above. For example, the signal generator may modulate a gain of the attenuator included in the sensing channel. Accordingly, during operation 802, the sensing signal generator may be initialized.

Method 800 may proceed to operation 804 during which a scan of a plurality of electrodes of a capacitive sensing device may be implemented. Accordingly, a scanning sequence may be implemented. As will be discussed in greater detail below, the scanning sequence may be implemented in accordance with designated scanning parameters, and measurements may be made based on sensed inputs received from the sensing device, and in accordance with the operation of the sensing signal generator, as similarly discussed above.

Method 800 may proceed to operation 806 during which scanning data may be collected based, at least in part, on the scan of the plurality of electrodes. Accordingly, the measured data may be stored in a memory device. Moreover, one or more computations may be implemented. For example, the measurements may be used to identify one or more events, such as touch events and/or hover events. Such computations may be made based on comparisons of the measurements to one or more threshold values, or any suitable event detection technique.

Figure 9:
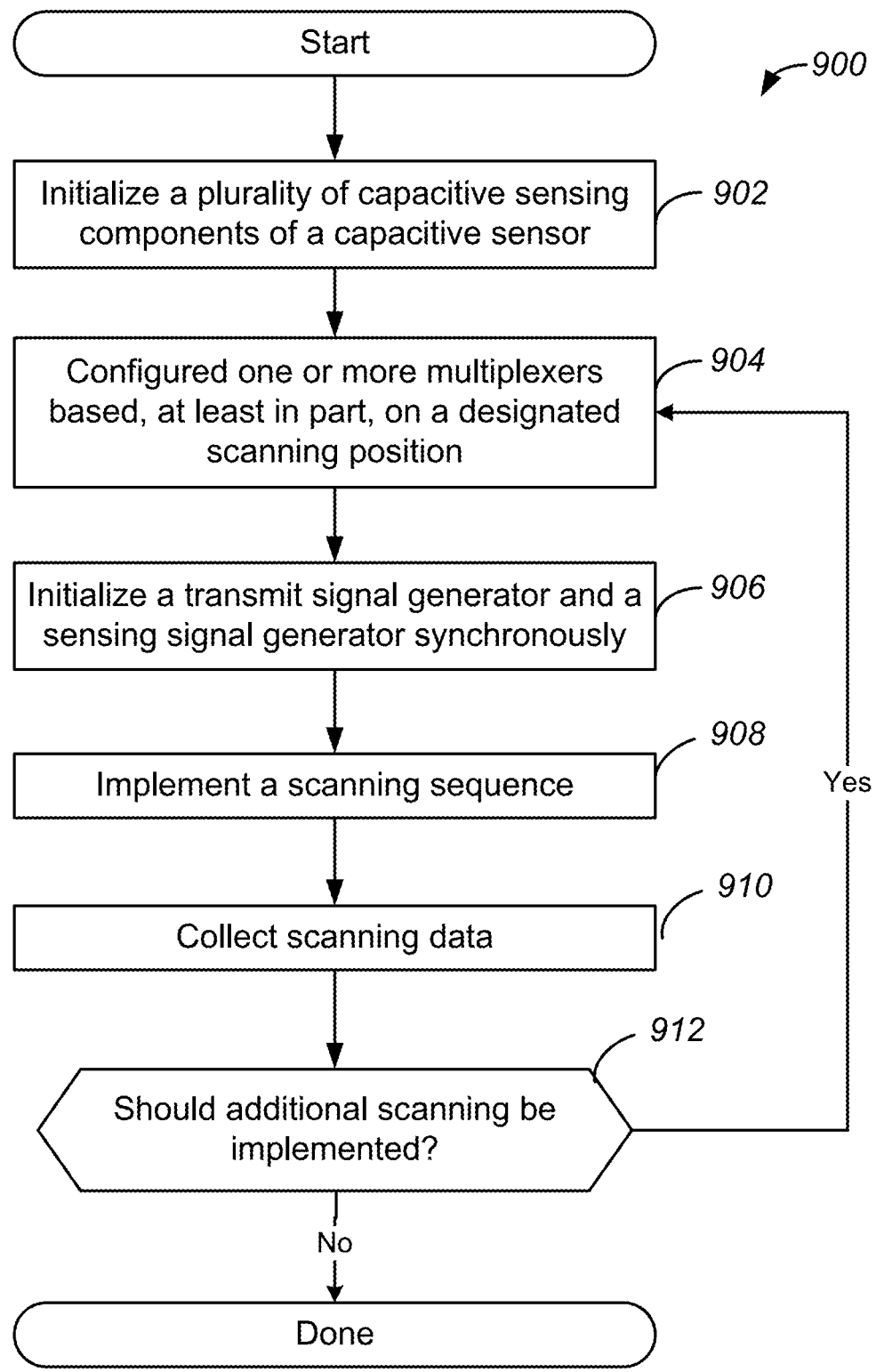
FIG. 9 illustrates a flow chart of another example a method for scanning a panel or other sensor array using multiple scan slots, implemented in accordance with some embodiments.

FIG. 9 illustrates a flow chart of another example of a method for sensitivity enhancement of capacitive sensors, implemented in accordance with some embodiments. As discussed above, a unique configuration of signal generators in a capacitive sensor may be implemented during run time to reduce noise in measurements that may manifest at, for example, odd harmonics. Accordingly, a method, such as method 900 may be implemented to control the operation of such signal generators and enhance the sensitivity of capacitive sensors, as discussed above.

Method 900 may commence with operation 902 during which one or more capacitive sensor electrodes may be initialized. In various embodiments, components such as signal generators and current sources may be initialized and configured based on one or more configuration parameters. In some embodiments of capacitance sensing configurations, a number of touch panel receive electrodes is much greater than a number of sensing channels. Accordingly, the entire panel needs to be scanned in several scanning slots, where in a particular scanning slot, a particular sensing channel connects a selected set of several electrodes in series during a particular scanning slot. Accordingly, as used herein, a scanning slot may be a particular configuration or set of a sensing channel and sensing electrodes that may be selected during several iterations of scanning used to scan an entire capacitive sensor which may include a touch panel.

Method 900 may proceed to operation 904 during which one or more multiplexers may be configured based on a designated scanning position. As discussed above, sensing devices may include multiple transmit and sensing electrodes that may be arranged in arrays having intersection points. In various embodiments, the electrodes may be scanned sequentially. Accordingly, during operation 904, a transmit and sensing multiplexer may be configured to select a particular electrode from the transmit electrodes and sensing electrodes. In various embodiments, such electrodes may be indexed by an identifier stored and maintained by a controller, and the multiplexers may be set based on a received select signal.

Method 900 may proceed to operation 906 during which the transmit signal generator and the sensing signal generator may be initialized synchronously. Accordingly, the transmit signal generator may be initialized and started, and the sensing signal generator may be initialized and started at the same time. As discussed above, the sequences and output of the signal generators are configured such that the transmit signal generator generates a drive signal used to drive transmit electrodes in sensing device, and the sensing signal generator generates a signal that modulates one or more components of the sensing channel to reduce and mitigate noise components of the sensed signal received in response to the drive signal. For example, the sensing signal generator may periodically modulate the gain of the attenuator of the sensing channel to effectively remove a noise component of the sensed signal.

Method 900 may proceed to operation 908 during which a scanning sequence may be implemented. Accordingly, as discussed above, once the signal generators have been initialized, the scanning sequence may be implemented for the selected electrode pair. The scanning sequence may be implemented at a particular scanning frequency and amplitude. Thus, during operation 908, the transmit signal generator may drive the transmit electrodes at a scanning frequency in accordance with scanning parameters, and the sensing signal generator generates a signal used to reduce noise components of the signal sensed in response to the drive signal. As previously discussed, this may include modulating the gain of an attenuator, and/or operating one or more switches implemented in combination with the attenuator.

Method 900 may proceed to operation 910 during which scanning data may be collected based, at least in part, on the scanning sequence. As discussed above, measurements may be made at a designated sampling rate, and the measured data may be stored in a memory device. As also discussed above, one or more computations may be implemented. For example, the measurements may be used to identify one or more events, such as touch events and/or hover events. Such computations may be made based on comparisons of the measurements to one or more threshold values, or any suitable event detection technique. In some embodiments, such computations may be made after all measurement data has been acquired from all electrodes.

Method 900 may proceed to operation 912 during which. It may be determined if additional scanning should be implemented. In various embodiments, such a determination may be made based on one or more aspects of the sensing device. As discussed above, the sensing device may include multiple electrodes that may be identified based on an index or an identifier. During a scanning sequence, the electrodes may be scanned sequentially. Accordingly, a controller may cycle through the electrodes until the last electrode is scanned, as may be determined based on the identifier. In one example, the controller may use a state machine configured to cycle through the electrodes in this manner. Thus, if it is determined that additional scanning should be implemented, method 900 may return to operation 904, and a different set of electrodes may be selected and scanned. If it is determined that no additional scanning should be implemented, method 900 may terminate.

Figure 10:
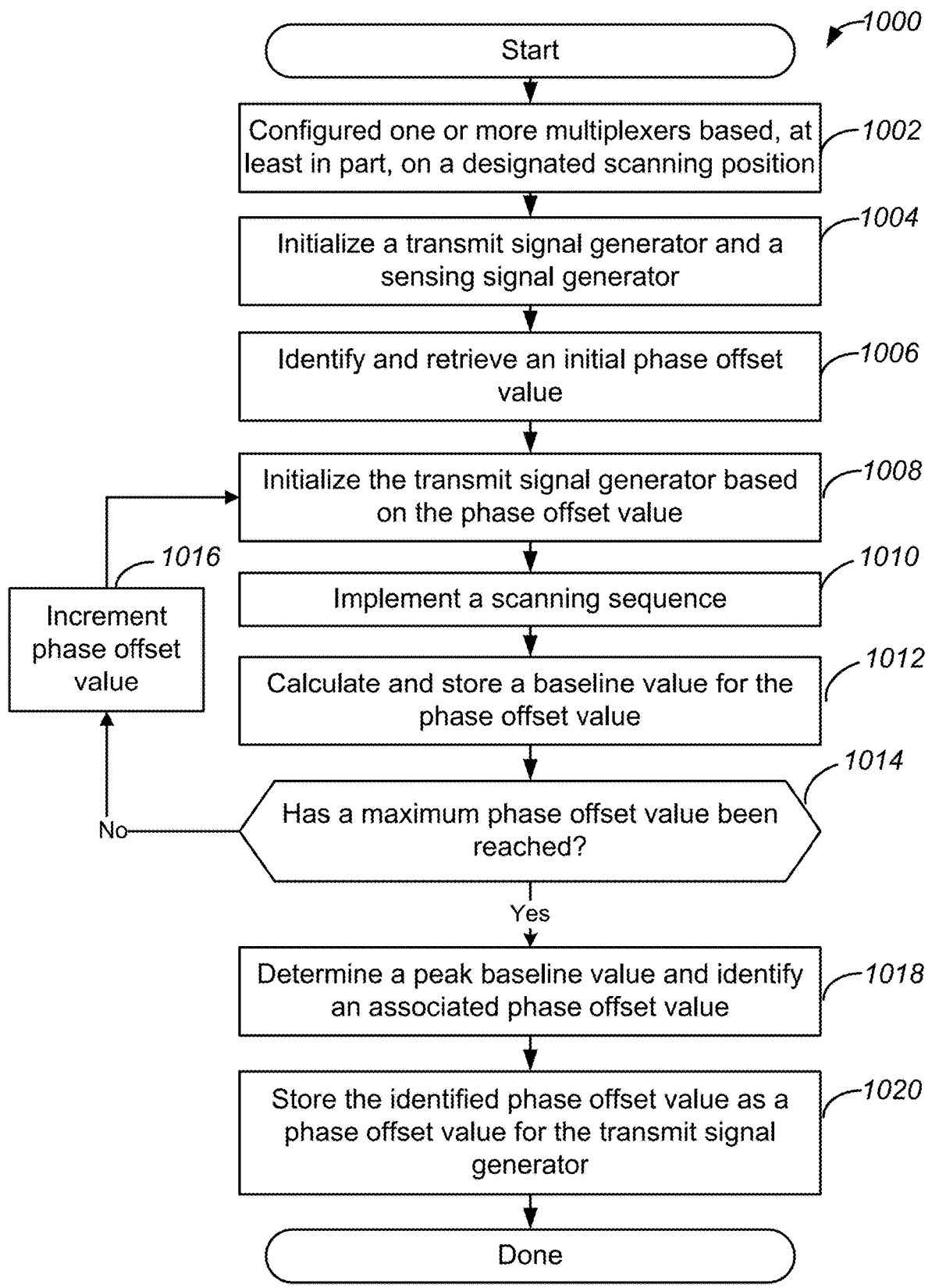
FIG. 10 illustrates a flow chart of an additional example of a method for enhancing sensitivity of capacitive sensors by providing a transmit signal phase calibration, implemented in accordance with some embodiments.

FIG. 10 illustrates a flow chart of an additional example of a method for sensitivity enhancement of capacitive sensors based on transmit signal phase adjustments, implemented in accordance with some embodiments. As discussed above, a unique configuration of signal generators in a capacitive sensor may be implemented during run time to reduce noise in measurements that may manifest at, for example, odd harmonics. Furthermore, a method, such as method 1000 may be implemented to calibrate a transmit signal generator to compensate for phase shifts introduced by components of a capacitive sensor, and thus increase the efficacy of the combination of signal generators discussed above. In various embodiments, to further increase sensitivity of capacitive sensors, an input sinusoidal waveform is phase aligned with an attenuator gain control signal. This alignment is accomplished based on a phase calibration procedure, discussed in greater detail below.

Method 1000 may commence with operation 1002 during which one or more multiplexers may be configured based on a designated scanning position. As discussed above, sensing devices may include multiple transmit and sensing electrodes that may be scanned sequentially. Accordingly, during operation 1002, a transmit and sensing multiplexer may be configured to select a particular electrode from the transmit electrodes and sensing electrodes. In various embodiments, such electrodes may be indexed by an identifier stored and maintained by a controller, and the multiplexers may be set based on a received select signal.

Method 1000 may proceed to operation 1004 during which a sensing signal generator and a transmit signal generator may be initialized. As discussed above, components such as signal generators and current sources may be initialized and configured based on one or more configuration parameters. Accordingly, during operation 1004, a sensing signal generator may be aligned in phase with a current source for that channel. Similarly, phase alignment may be implemented for components of the transmit channel.

Method 1000 may proceed to operation 1006 during which an initial phase offset value may be identified and retrieved. In various embodiments, a phase offset value may be identified for the transmit signal generator. Such a phase offset value may have been stored as a designated default phase value to be used at the beginning of a calibration procedure. Such a value may have been determined by a manufacturer or user during an initial configuration of the capacitive sensor. In one example, the initial phase offset value may be a value of 0, and the phase offset value may be increased in designated increments, as will be discussed in greater detail below.

Method 1000 may proceed to operation 1008 during which the transmit signal generator may be initialized based on the phase offset value. Accordingly, the transmit signal generator may be configured to implement the phase offset when generating an output signal. In this way, the phase offset may be implemented with driving the transmit electrodes of the capacitive sensing device.

Method 1000 may proceed to operation 1010 during which a scanning sequence may be implemented. Accordingly, as discussed above, once the signal generators have been initialized and the phase offset value has been loaded, the scanning sequence may be implemented. The scanning sequence may be implemented at a particular scanning frequency and amplitude. Thus, during operation 1010, the transmit signal generator may drive the transmit electrodes at a scanning frequency in accordance with scanning parameters, and the sensing signal generator generates a signal used to reduce noise components of the signal sensed in response to the drive signal.

Method 1000 may proceed to operation 1012 during which a baseline value may be calculated and stored for the phase offset value. Accordingly, the measurement data may be stored, and a baseline value may be computed that represents a baseline amplitude or magnitude of the received signal. Accordingly, one or more averaging techniques or other computational techniques may be implemented to compute a baseline value representative of a sensitivity of the sensing channel at the selected phase offset value. In various embodiments, the baseline value can be proportional to the total output of the charge to time converter, as discussed above, with reference to FIG. 2 and FIG. 4. For example, the baseline value may be computed by summing the balancing time intervals for a scanning burst (for example, for 10 transmit periods).

Method 1000 may proceed to operation 1014 during which it may be determined if a maximum phase offset has been reached. In various embodiments, such a determination may be made by a controller based, at least in part, on the phase offset value itself. As previously discussed, the phase offset value may be set at an initial value, and may be incremented through a designated range. Accordingly, the controller may include a state machine configured to step through the offset value increments until a maximum value is reached. In some embodiments, the maximum value may be a designated value set by a user or manufacturer. For example, the maximum value may correspond to a phase offset of a full period or a half period of the transmit frequency used by the transmit signal generator. If it has been determined that a maximum phase offset value has not been reached, method 1000 may proceed to operation 1016.

Method 1000 may proceed to operation 1016 during which the phase offset value may be incremented. As discussed above, the phase offset value may be incremented in accordance with a designated incrementation scheme. More specifically, the controller may be configured to increment the phase offset value by a designated amount, such as a designated number of degrees, and the incremented value may be stored as the new phase offset value to be used. Method 1000 may then return to operation 1008 and additional measurements may be made, and additional baseline values may be computed until the maximum phase offset value has been reached.

Returning to operation 1014, if it has been determined that the maximum phase offset value has been reached, method 1000 may proceed to operation 1018 during which a peak baseline value may be identified. Accordingly, the computed baseline values may be compared, and a maximum baseline value may be identified that has a highest baseline value. The phase offset value associated with the maximum baseline value may also be identified.

Method 1000 may proceed to operation 1020 during which the phase offset value associated with the peak baseline value may be selected and stored as a phase offset value for the transmit signal generator. Accordingly, the phase offset value identified during operation 1018 may be stored in a memory device, and may be used to initialize and configure the transmit signal generator during subsequent scanning operations. In this way, the transmit signal generator may be configured to compensate for various phase shifts introduced by components included in a capacitive sensor.

Figures 11A, 11B:
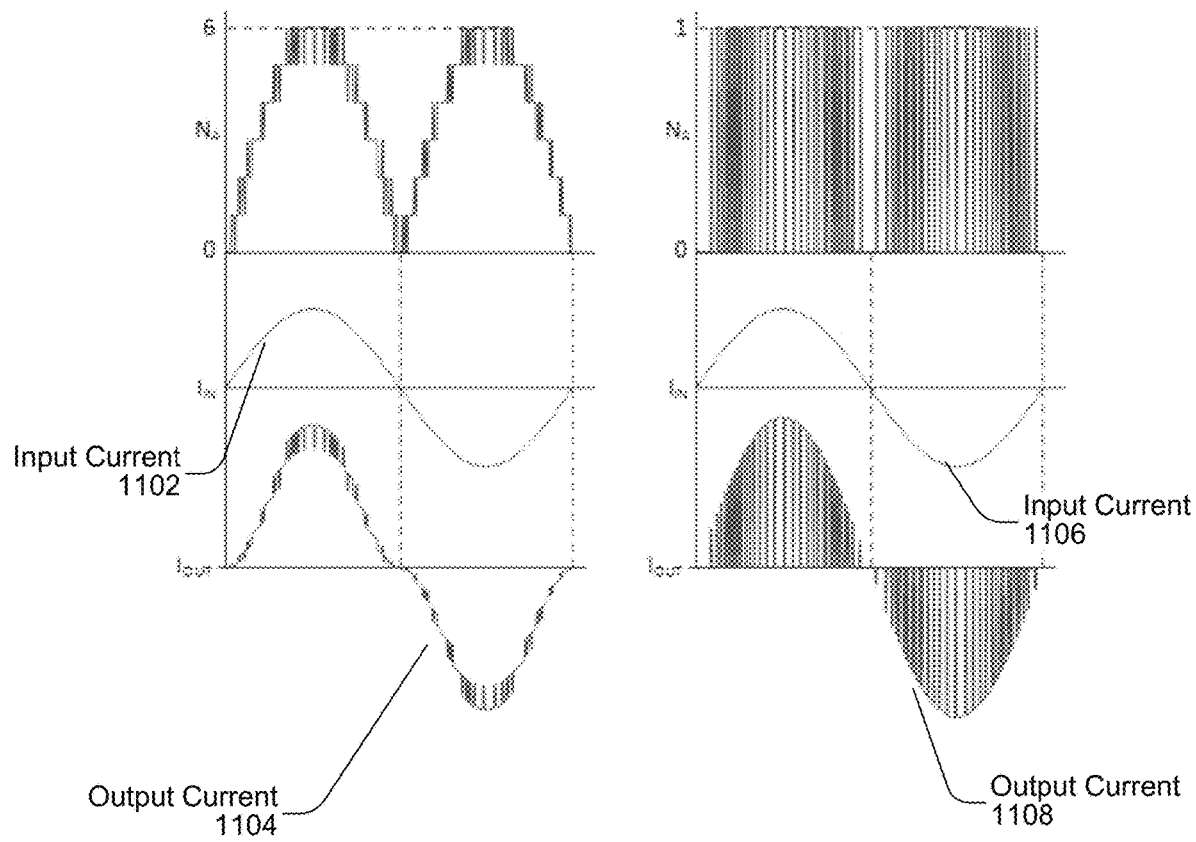
FIGS. 11A and 11B illustrate diagrams of examples of an attenuator input and output having different numbers of gain steps, implemented in accordance with some embodiments.

FIGS. 11A and 11B illustrate diagrams of examples of an attenuator input and output having different numbers of gain steps, implemented in accordance with some embodiments. More specifically, FIG. 11A illustrates attenuator input current 1102 and attenuator output current 1104 for an attenuator having seven gain levels implemented with a 3-bit quantizer. Moreover, FIG. 11B illustrates attenuator input current 1106 and attenuator output current 1108 for an attenuator having two gain levels implemented with a 1-bit quantizer. In various embodiments, the output currents approximate a $\sin^2(t)$ function similar to a traditional analog multiplier. As shown in FIGS. 11A and 11B, an increase in a number of gain levels may provide better approximation of the sinusoidal signal.

Figures 12A, 12B:
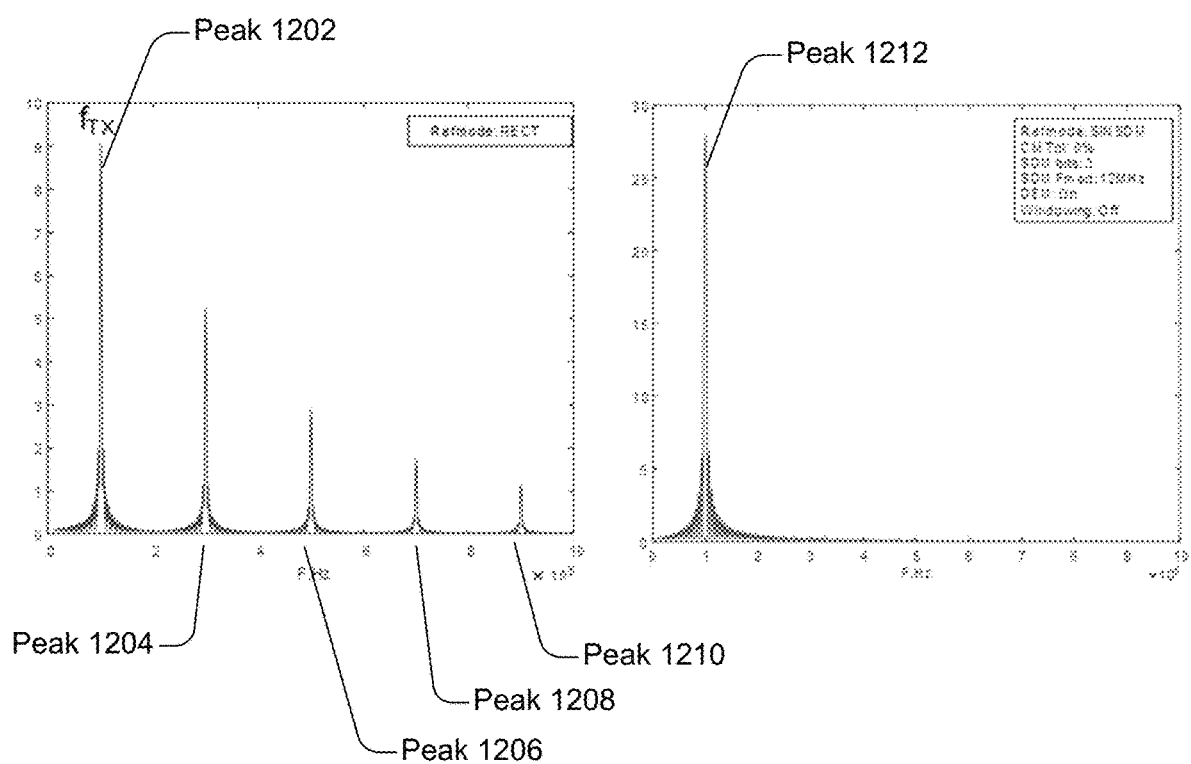
FIGS. 12A and 12B illustrate diagrams of examples of signals sensed by one or more sensing channels, implemented in accordance with some embodiments.

FIGS. 12A and 12B illustrate diagrams of examples of signals sensed by one or more sensing channels, implemented in accordance with some embodiments. More specifically, FIG. 12A illustrates a sensed signal at a particular transmit frequency, where the sensed signal is sensed by a sensing channel that is not configured to provide noise immunity, as disclosed herein. In various embodiments, the sensing of the transmit signal at the transmit frequency, also referred to herein as an operation frequency, is represented by peak 1202. FIG. 12A further illustrates additional peaks at odd harmonics of the operation frequency, such as peak 1204, peak 1206, peak 1208, and peak 1210. As discussed above, such peaks are measurement noise that degrade the overall signal-to-noise ration of the capacitive sensor.

In various embodiments, FIG. 12B illustrates a sensed signal at a particular transmit frequency, where the sensed signal is sensed by a sensing channel that is configured to provide noise immunity, as disclosed herein. Accordingly, the sensing of the transmit signal at the transmit frequency is represented by peak 1212. As shown in FIG. 12B, there are no other peaks associated with odd harmonics. Accordingly, the peaks in the measured signal caused by the odd harmonics has been removed, and the overall signal-to-noise ratio of the capacitive sensor has been improved.

Although the foregoing concepts have been described in some detail for purposes of clarity of understanding, it will be apparent that certain changes and modifications may be practiced within the scope of the appended claims. It should be noted that there are many alternative ways of implementing the processes, systems, and devices. Accordingly, the present examples are to be considered as illustrative and not restrictive.

What is claimed is:

1. A device comprising: an attenuator configured to receive an input from at least one sense electrode of a capacitive sensing device, the attenuator being included in a sensing channel of a capacitive sensor; a signal generator coupled to an input of the attenuator, the signal generator comprising one or more processors configured to: generate a sinusoidal signal based, at least in part, on one or more noise characteristics of a scan sequence associated with one or more transmit electrodes of the capacitive sensing device; and provide the sinusoidal signal to the input of the attenuator; and
    wherein the device further comprises: a mixer configured to combine the sinusoidal signal received from the signal generator and the input received from the at least one sense electrode, and further configured to generate an output based on the combining.

2. The device of claim 1, wherein the signal generator comprises a sinusoidal modulator.

3. The device of claim 1, wherein the mixer is a variable gain amplifier configured to change gain based on gain control signal.

4. The device of claim 1, wherein the signal generator is configured to use the sinusoidal signal to modulate a gain of the attenuator, and wherein the sinusoidal signal is a rectified sinusoidal signal.

5. The device of claim 1, wherein the signal generator is configured to provide the sinusoidal signal to the attenuator during the scan sequence.

6. The device of claim 1, wherein the signal generator is further configured to implement a window function.

7. The device of claim 1, wherein the at least one sense electrode and the one or more transmit electrodes are included in an electrode array of a capacitive touch screen.

8. The device of claim 1, wherein the signal generator is configured to be synchronous with a transmit signal generator, and wherein the transmit signal generator is configured to implement a phase offset value.

9. The device of claim 8, wherein the phase offset is determined based on a peak response of the capacitive sensor.

10. A method comprising: generating a transmit drive signal based, at least in part, on one or more scanning parameters, the transmit drive signal being provided to one or more transmit electrodes of a capacitive sensing device; generating, using a signal generator, a sinusoidal signal based, at least in part, on one or more noise characteristics of the transmit drive signal and capacitive sensing device; receiving a sensed signal from at least one sense electrode of the capacitive sensing device; reducing the one or more noise characteristics in the sensed signal based, at least in part, on the sinusoidal signal; and wherein the reducing comprises: combining, using a mixer, the sensed signal with the sinusoidal signal at an input of an attenuator.

11. The method of claim 10, wherein the signal generator comprises a sinusoidal modulator.

12. The method of claim 10, wherein the mixer is a variable gain amplifier configured to change gain based on a gain control signal.

13. The method of claim 10, wherein the reducing comprises:
    modulating a gain of an attenuator based, at least in part, on the sinusoidal signal.

14. A system comprising: a plurality of sense electrodes implemented in a capacitive sensing device; a plurality of transmit electrodes implemented in the capacitive sensing device; and an attenuator configured to receive an input from at least one of the plurality of sense electrodes, the attenuator being included in a sensing channel of a capacitive sensor; and a signal generator coupled to an input of the attenuator, the signal generator comprising one or more processors configured to:
    generate a sinusoidal signal based, at least in part, on one or more noise characteristics of a scan sequence associated with one or more transmit electrodes of the capacitive sensing device; provide the sinusoidal signal to the input of the attenuator; a controller configured to implement the scan sequence and obtain a plurality of measurements based on the scan sequence; and wherein the device further comprises: a mixer configured to combine the sinusoidal signal received from the signal generator and the input received from the at least one of the plurality of sense electrodes, and further configured to generate an output based on the combining.

15. The system of claim 14, wherein the signal generator comprises a sinusoidal modulator.

16. The system of claim 14, wherein the signal generator is configured to use the sinusoidal signal to modulate a gain of the attenuator.

17. The system of claim 14, wherein the signal generator is configured to provide the sinusoidal signal to the attenuator during the scan sequence.

* * * * *